United States Patent [19]

Lebow et al.

[11] 4,159,222

[45] Jun. 26, 1979

[54] METHOD OF MANUFACTURING HIGH DENSITY FINE LINE PRINTED CIRCUITRY

[75] Inventors: Sanford Lebow, Westlake Village; Daniel Nogavich, Newbury Park; Eugene Nogavich, Thousand Oaks, all of Calif.

[73] Assignee: Pactel Corporation, Newbury Park, Calif.

[21] Appl. No.: 758,441

[22] Filed: Jan. 11, 1977

[51] Int. Cl.² .............................................. H05K 3/12
[52] U.S. Cl. ..................................... 156/632; 156/631; 156/645; 156/902; 156/153; 156/233; 156/249; 156/289; 204/15; 204/23; 204/32 R; 204/38 E; 427/96; 427/264; 427/282; 427/409
[58] Field of Search ............... 156/629, 632, 634, 645, 156/656, 661, 901, 902, 233, 241, 249, 555, 289, 631, 153; 96/36.2; 204/15, 20, 23, 32 R, 38 E, 38 B, 11; 29/423; 427/282, 96, 264, 409; 174/68.5

[56] References Cited

U.S. PATENT DOCUMENTS

| | | | |
|---|---|---|---|
| 2,254,429 | 9/1941 | Kreutzer | 29/423 |
| 2,387,631 | 10/1945 | Weir | 156/555 |
| 2,728,693 | 12/1955 | Cado | 204/15 |
| 2,748,048 | 5/1956 | Russell | 156/289 |
| 3,152,938 | 10/1964 | Osifchin et al. | 156/901 |
| 3,181,986 | 5/1965 | Pritkin | 156/233 |
| 3,791,858 | 2/1974 | McPherson et al. | 96/36.2 |
| 3,871,930 | 3/1975 | Fish | 156/901 |
| 3,947,957 | 4/1976 | Luttmer | 156/634 |
| 3,990,926 | 11/1976 | Konicek | 156/233 |

OTHER PUBLICATIONS

Lyman, J., "Flexible Circuits...Will", *Electronics,* Sep. 1977, (pp. 98-105).
*An Introduction to Photo Fabrication Using KODAK Photosensitive Resists,* Eastman Kodak Co., Rochester, N.Y., p. 22.

*Primary Examiner*—Jerome W. Massie
*Attorney, Agent, or Firm*—Fraser and Bogucki

[57] ABSTRACT

The method of manufacturing printed circuitry with sufficiently high resolution to permit line densities of at least 1 mil lines on 3 mil centers includes the steps of placing a thickness of dry film photoresist on a smooth, polished substrate or carrier optionally, applying a thin lubricating layer of spray wax to the exposed surface of the photoresist, wringing a mask defining a desired conductive circuit pattern into high integrity, intimate contact with the surface of the resist, exposing and developing the resist to remove the resist from the smooth surface in regions where the conductive circuit pattern is to be formed, electroplating the conductors within the voids formed in the resist; removing all remaining resist, laminating a flowable dielectric material to the smooth surface of the substrate and the conductive circuit pattern, and removing the laminate material and conductive circuit pattern from the smooth surface. If desired, conductive via interconnects can be selectively formed and additional layers of circuit patterns can be formed atop the first high resolution layer.

16 Claims, 8 Drawing Figures

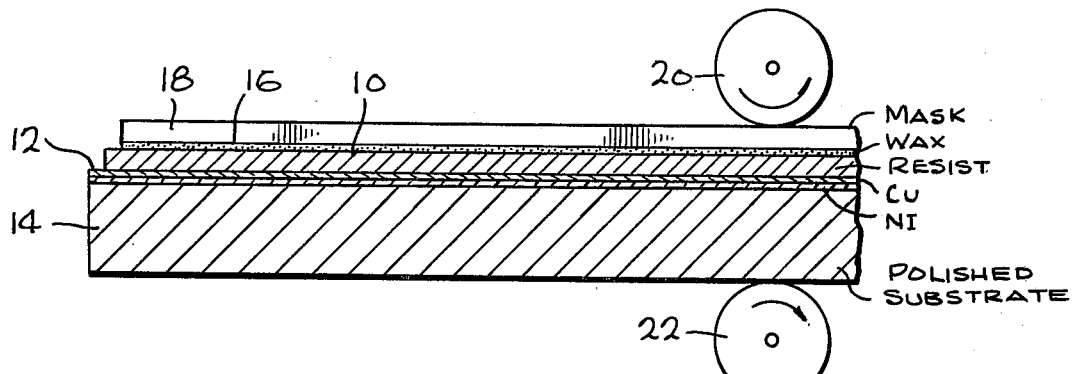
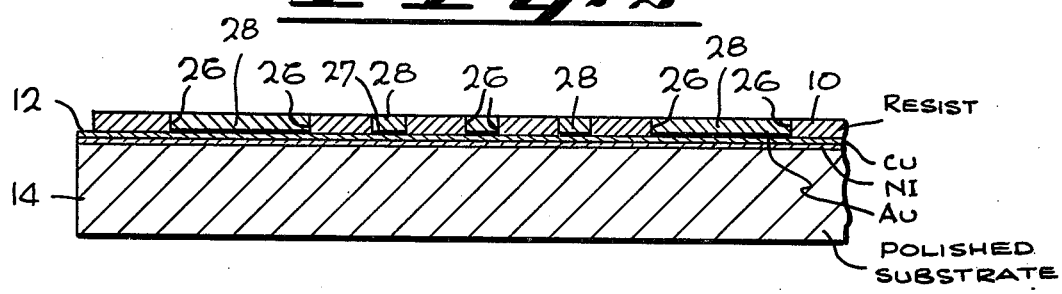
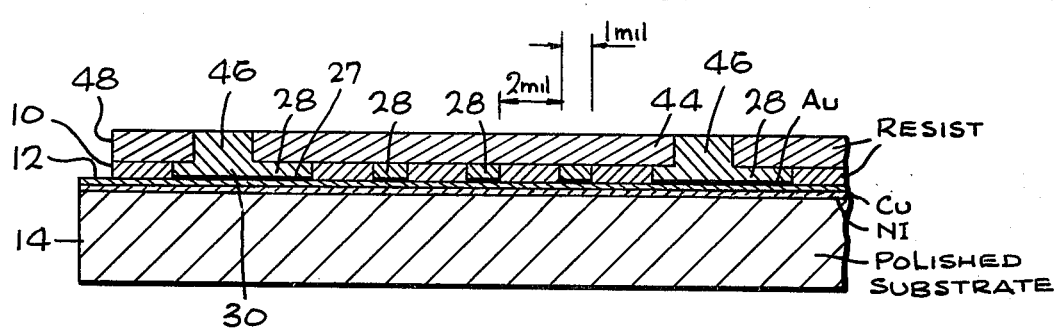
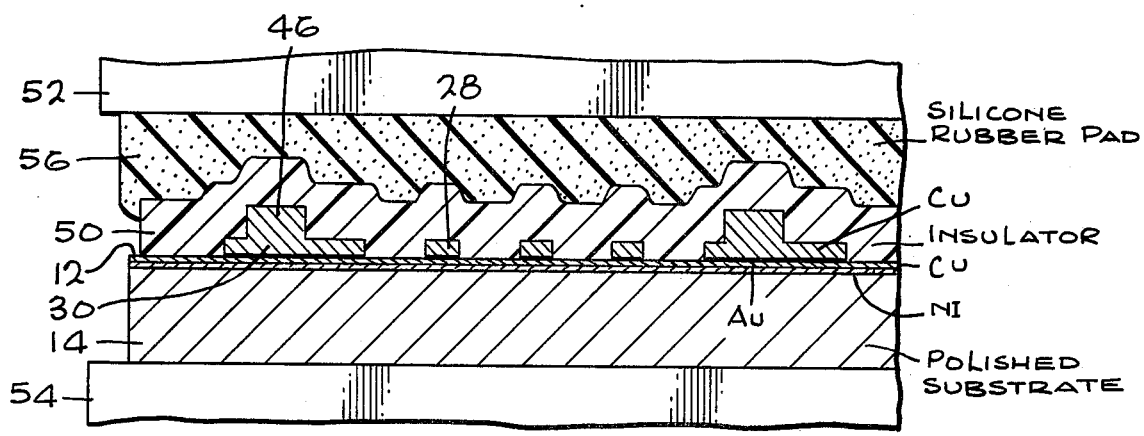

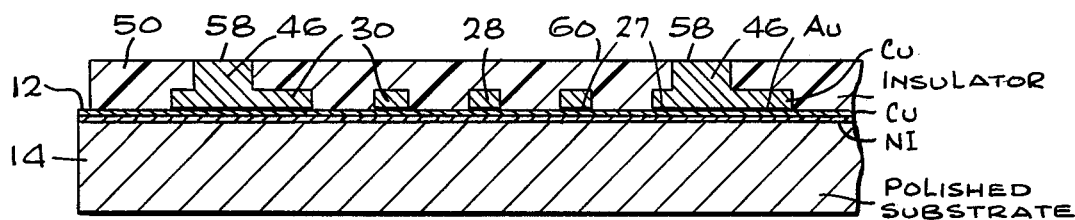
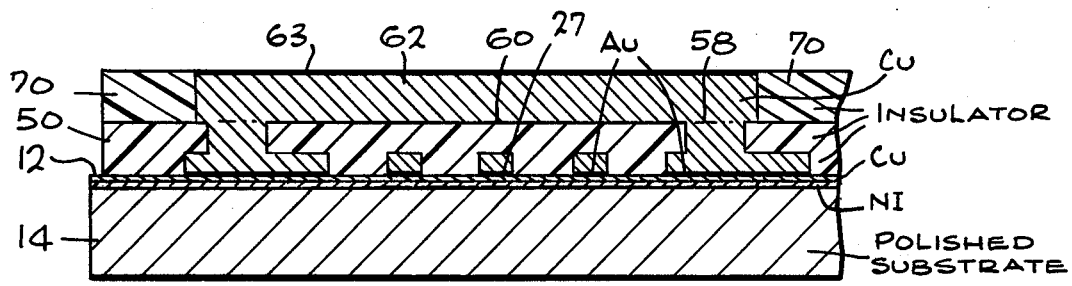
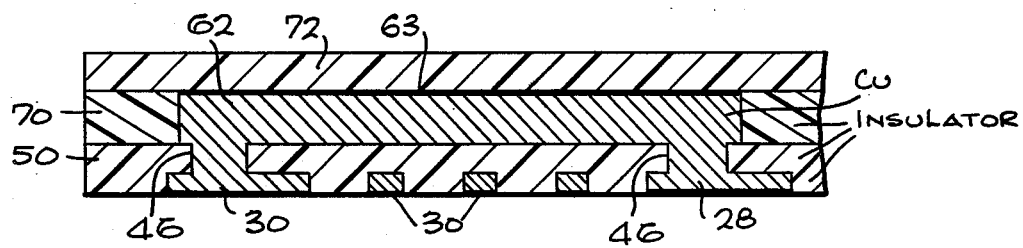
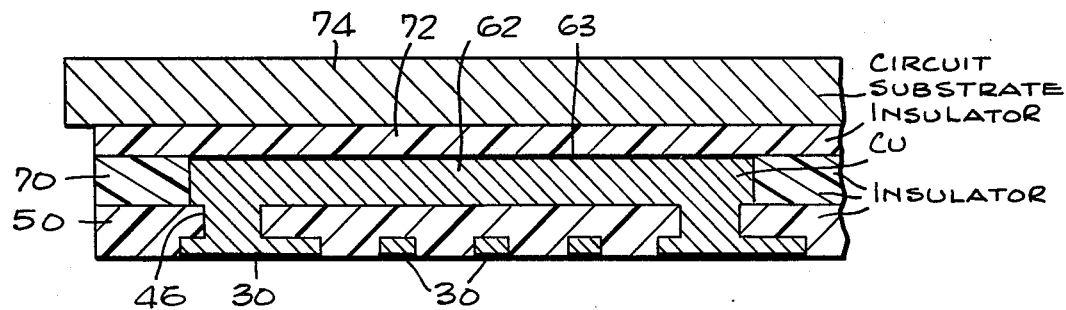

METHOD OF MANUFACTURING HIGH DENSITY FINE LINE PRINTED CIRCUITRY

CROSS REFERENCE TO RELATED APPLICATION

This application is related to application Ser. No. 758,442, filed Jan. 11, 1977 for "High Density Printed Circuit," by Lebow et al.

BACKGROUND OF THE INVENTION

1. Field of the Invention

This invention relates to a method of manufacturing high density fine line resolution printed circuitry and more particularly to a method in which the printed circuitry is formed on a polished, removable substrate using a high resolution photographic process.

2. Description of the Prior Art

Printed circuitry may be formed on ceramic, metal, resin and even flexible film substrates and is utilized to interconnect individual circuit components such as resistors, capacitors, inductors and semiconductor devices including complex integrated circuits. A conductive printed circuit pattern may vary from a simple pattern of radially extending conductors for connecting an integrated circuit chip to a lead frame to a highly complex multilayer pattern for interconnecting many complex circuit components.

The trend has been to require more and more complex printed circuitry with higher densities of printed conductors in order to accommodate increasingly complex circuit components in decreasing space to reduce costs and improve reliability. While line resolutions of 1 micron or better have been attained on semiconductor integrated circuits, the best resolution that is currently commercially available for printed circuitry interconnecting nonmonolithic circuit components is 5 mil wide lines on 10 mil centers. Substantial irregularities in circuit conductors have thwarted attempts to attain adequate yields because of short circuits, open circuits and high resistance narrow conductor regions. These irregularities result from a number of factors including surface roughness of the substrate, diffusion and diffraction of the exposure light as it passes through the photo mask, photoresist and irregular edge development of exposed photoresist and uneven etching of masked conductive layers.

A number of processes for forming printed circuitry on nonpermanent smooth substrates are described in U.S. Pat. Nos. 2,692,190; 2,721,822; 2,724,674; 3,181,986 and 3,350,498. However, none of these processes is capable of attaining the commercially practical, high resolution printed circuitry that is attainable with methods in accordance with the present invention.

SUMMARY OF THE INVENTION

The method of manufacturing high density, fine line resolution printed circuitry in accordance with the invention includes the steps of placing a thickness of photosensitive material on a smooth surface of a substrate; optionally applying a thin lubricating film of lubricant to the top surface of the photosensitive material; placing a photomask defining a conductor circuit pattern adjacent the surface of the photosensitive material; wringing the photomask into intimate, continuous contact with the photosensitive surface; exposing and developing the photosensitive material to expose the smooth surface in regions where a conductive circuit pattern is to be formed; forming a conductive circuit pattern on the smooth surface in said regions; removing all remaining photosensitive material from the smooth surface; laminating a layer of flowable polyamideimide dielectric material to the smooth surface and conductive circuit pattern; and removing the insulator material and conductive pattern from the smooth surface.

It is also possible to form additional layers of conductive circuit patterns prior to removing the printed circuit. The printed circuit may be laminated to a metal or other substrate using the dielectric or insulator material as an adhesive. To form each additional level of printed circuitry a circuit layer containing a conductive circuit pattern of upwardly extending, raised via conductors or interconnects is formed on the preceding circuit layer before laminating the insulator material. The top surface of the insulator material is removed by sanding or otherwise to form a smooth surface coplanar with the tops of the raised interconnects. The process for the first layer of circuit pattern can then be repeated to construct a second level of printed circuitry that is selectively interconneced with the preceding lower level by the elcctroplated raised interconnects.

BRIEF DESCRIPTION OF THE DRAWINGS

A more complete understanding of the invention may be had from a consideration of the following detailed description, taken in conjunction with the accompanying drawings in which:

FIGS. 1-6 are sectional side views of a high density printed circuit in accordance with the invention illustrating successive stages in the manufacturing process; and FIGS. 7A and 7B are sectional side views illustrating alternative embodiments of high line density printed circuits in accordance with the invention.

DETAILED DESCRIPTION

A printed circuit having high density, fine lines of printed conductors is manufactured in accordance with the invention on a polished substrate using an additive process in combination with photolithographic techniques. Referring now to FIG. 1, a 0.6 mil (0.001524cm) thick uniform layer of dry film photoresist 10 or other photosensitive material of suitable uniform thickness is applied to a polished surface 12 of a substrate 14. While the thickness of the dry film resist is not critical, it should be at least as thick as a desired printed conductor and greater thicknesses tend to reduce the attainable line definition. A thickness of 0.6 mil is used in the present example for both resist and printed conductors. The substrate 14 is reusable and may be a stainless steel plate of suitable thickness of about ⅛-¼ inch with a highly polished top surface 12. A thin layer of releasing material such as a 0.1 mil thick flash of nickel is applied to the polished surface 12 before the photoresist layer 10 is applied thereto. The releasing agent merely makes it possible to peel the printed circuit away from the substrate 14 after formation of the printed circuit is complete. In addition, thin layers of copper may be deposited on the releasing layer before the layer 12 of photoresist is placed upon the substrate.

A very thin layer 16 of a lubricating material such as wax is then optionally applied to the exposed surface of the photoresist. The lubricant may be a common household spray wax such as one product that is available under the trademark PLEDGE and is applied by simply spraying a thin film onto the exposed surface of the photoresist 10. The surface of the layer of photoresist 10 tends to be somewhat sticky and the layer of lubricant 16 permits fine positioning of the mask 18 while in contact with the lubricated exposed surface of the layer of photoresist 10 for proper alignment. However, fine positioning of the first layer is often unnecessary and the lubricant can be omitted.

After the mask 18 is placed atop the surface of the layer of photoresist 10, a wringing operation is performed to remove any gas or air bubbles from between the mask 18 and layer of photoresist 10 and bring the mask 18 into high integrity continuous contact with the surface of the layer of photoresist 10. By way of example, the wringing may be accomplished by passing the substrate 14, layer of photoresist 10 and mask 18 through a pair of pressure pinch rollers 20, 22.

After wringing, the photoresist is exposed in a conventional manner to collimated light and developed to remove portions of the layer of photoresist 10 from the region where conductive circuit patterns are to be formed. Because the mask is brought into extremely close contact with the layer of photoresist 10 and because the prior wringing operation minimizes diffraction as light passes from the mask 18 to the layer of photoresist 10, the light exposure forms an extremely high resolution sharp line pattern in the photoresist 10 and upon developing, extremely straight, vertical walls 26 are formed at the boundaries defining the cavities from which the portions of the layer of photoresist 10 are removed. A thin layer 27 of gold or nickel is electroplated in the cavities defining the conductive circuit pattern as a mask to protect the conductive circuit pattern when the release material is later etched. A conductive material 28 such as copper, gold or nickel is then electroplated onto the conductive, polished surface 12 as shown in FIG. 2 to form the conductive circuit pattern defined by the photomask 18. This additive process causes the line edges of the conductive pattern to be straight and perpendicular because they conform in shape to the walls of the photoresist. A subtractive process in which a complete layer of copper is first deposited and then selectively etched has not achieved this fine resolution because undercutting occurs beneath the photoresist mask and the etched walls are not as smooth and sharp as those attainable in the photoresist.

Although not required for single layer printed circuit patterns, if a second circuit pattern layer is to be formed, an interconnect pattern is next formed atop the first layer printed circuit pattern 30 as shown in FIG. 3. The interconnect circuit pattern may be formed by a conventional photolithographic process either by plating and then photolithographically etching or as illustrated in FIG. 3 by first defining a desired interconnect pattern through a masking layer of photoresist material 44 and then electroplating the interconnects 46 within the voids formed by the masking layer 44. Because first portions of the first layer of photoresist 10 are yet to be removed, pads for the interconnects should be provided in the first circuit layer 30 with sufficient area that the interconnects 46 need not extend beyond underlying portions of the first layer printed circuit pattern 30. Thus, upon formation of the interconnects 46 both layers 10, 44 of photoresist may be stripped completely from the partially manufactured printed circuit. In the absence of the smooth, polished surface 12, additional circuit layers cannot be obtained with the same high density line resolution as the first circuit layer and the interconnects 46 should therefore have a minimum thickness of approximately 1 mil and preferably 2 mils beyond the thickness of the circuit layer 30 and should have minimum dimensions of about 2 mils in the plane of a second layer 48 within which the interconnects 46 and second layer of photoresist 44 lie.

Making reference to FIG. 4, the first and second layers of photoresist are completely stripped from the partially formed printed circuit and a flowable, somewhat plastic insulating material 50 is laminated to the remaining conductive first layer printed circuit pattern 30 and interconnect pattern 46. For best uniformity, the insulating material 50 is applied as a thin preformed sheet of dry film material having a uniform thickness at least as great as the combined thicknesses of the first circuit pattern 30 and interconnects 46. For example, in the present example the combined thickness is $0.6+2.0=2.6$ mil and a 4 mil thick layer of insulating material 50 is satisfactory. The insulator material 50 is suitably cured in a laminating press having press plates 52, 54 and a silicone rubber pad layer 56 between the insulating material 50 and the opposing adjacent press plate 52. The insulating material 50 is preferably a polyamideimide material adhesive film which is commercially available under the trademark Kerimid 501 from Rhodia Inc., 600 Madison Ave., New York, N.Y. 10022. If this material is used it should be cured for two hours at a temperature of 190° centigrade under a pressure of 100 pounds per square inch to cause the insulating material 50 to flow into the voids between the conductors and attain a high strength bond with the copper conductors. Next, excess insulator material 52 is removed from the partially completed printed circuit to provide a top surface 60 that is flat and coplanar with the tops 58 of the interconnects 46. The material 50 may be removed using a suitable process such as sanding with a very fine grade of sandpaper. The resulting structure is illustrated in FIG. 5.

Referring now to FIG. 6, a second layer printed circuit pattern 62 may then be formed atop the surfaces 58 and 60 by any suitable process. For example, a complete layer of copper may be plated and then selectively etched to leave the desired circuit pattern. Alternatively, a thin layer of copper may be electroless deposited upon the surfaces 58 and 60 and electroplated to a thickness of about 0.1 mil. Photoresist is then placed on the plated surface and a desired circuit pattern is defined as voids within the layer of photoresist. The thin layer of plated copper is utilized as a conductor to permit the electroplating of the desired circuit pattern within the voids in the photoresist. A thin layer 63 of nickel is electroplated as a mask atop the conductive circuit pattern. Upon stripping of the photoresist, a rapid etch removes the deposited thin layer of copper from regions where a conductive circuit pattern is not desired. The second layer pattern 62 preferably has a thickness of about 2 mils. After stripping of the photoresist, a second layer 70 of flowable insulating material such as Kerimid 501 is laminated to the second layer printed circuit pattern 62 and first layer of insulating material 50 in a laminating press as described in conjunction with FIG. 4.

A thin layer or flash of nickel may be electro deposited upon the second layer printed circuit pattern 62 before laminating to provide a stronger bond between the second layer printed circuit pattern 62 and second layer of laminating material 70. Sanding may then be used to smooth the second layer of insulating material 70 as illustrated in FIG. 6.

The printed circuit may then be completed as illustrated in FIG. 7A or alternatively as illustrated in FIG. 7B. In FIG. 7A the printed circuit has been completed by laminating one or more additional layers of Kerimid 501 insulating material to the top of the structure to form a high density, flexible multilayer printed circuit. In the alternative arrangement shown in FIG. 7B, the additional layers of Kerimid 501 insulating material 72 are utilized to bond a metal circuit substrate 74 to the top of the second layer printed circuit structure 62 and insulating material 70 to provide a stable printed circuit structure with good heat transfer capability. In either case, the printed circuit structure is removed from the polished surface 12 of substrate 14 and the thin layers of copper and nickel release material may be removed from unwanted regions of the surface of the first layer printed circuit 30 and insulating material 50 by etching. It will be appreciated that additional layers of printed circuitry can optionally by formed upon the second layer printed circuit 62 in a manner similar to that in which the second layer printed circuit pattern 62 was formed upon and interconnected with the first layer printed circuit 30.

While there have been shown and described above preferred methods of manufacturing a high line density, high resolution printed circuit in accordance with the invention for the purpose of enabling a person of ordinary skill in the art to make and use the invention, it will be appreciated that the invention is not limited thereto. Accordingly, any modifications, variations or equivalent methods within the scope of the attached claims should be considered to be within the scope of the invention.

What is claimed is:

1. The method of manufacturing high line density sharp resolution printed circuitry comprising in order the steps of:
    placing a thickness of photosensitive material at least equal to a selected conductor thickness on a smooth, polished surface of a substrate to form a surface of photosensitive material over a given area of the smooth surface;
    placing a photomask defining a conductor circuit pattern adjacent the surface of the photosensitive material in intimate, continuous contact with the surface of the photosensitive material;
    photo exposing and developing the photosensitive material to remove said material from regions of the smooth surface where a conductive circuit pattern is to be formed;
    forming a conductive circuit pattern of a selected thickness in regions of the smooth surface where a conductive circuit pattern is to be formed;
    removing all remaining photosensitive material from the smooth surface;
    laminating uniformly thick preformed film of flowable insulator material to the smooth surface and conductive circuit pattern formed thereon; and
    stripping the insulator material and conductive circuit pattern from the smooth surface.

2. The method according to claim 1 above wherein the step of placing a thickness of photosensitive material comprises the step of placing a dry film photoresist material having a uniform thickness at least equal to a selected conductor thickness on the smooth surface of the substrate to form a surface of photosensitive material over a given area of the smooth surface.

3. The method according to claim 1 above, further comprising between the steps of placing photosensitive material and placing a photomask the step of applying a thin lubricating film of lubricant to the surface of the photosensitive material.

4. The method according to claim 3 above, wherein the step of applying a thin lubricating film comprises the step of spraying a thin lubricating film of wax lubricant onto the surface of the photosensitive material.

5. The method according to claim 1 above, wherein the step of placing a photomask comprises the step of passing the substrate, photosensitive material, and photomask between a pair of pressure pinch rollers to wring the photomask into intimate, continuous contact with the surface of the photosensitive material.

6. The method according to claim 1 above, wherein the step of laminating comprises the step of laminating a uniformly thick sheet of preformed dry film polyamideimide flowable insulator material to the smooth surface and conductive circuit pattern formed thereon.

7. The method according to claim 1 above, further comprising the additional steps executed between the steps of laminating and stripping of:
    removing part of the insulator material adjacent a surface thereof to form a planar surface of insulator material coplanar with a plane defined by a surface of the conductive circuit pattern opposite the smooth surface of the substrate; and
    laminating a second uniformly thick preformed film of said flowable insulator material to the planar surface and the surface of the conductive circuit pattern.

8. The method according to claim 1 above further comprising the additional step executed between the steps of forming and removing of:
    forming interconnects at selected locations atop the conductive circuit pattern, said interconnects extending away from the surface of the conductive circuit pattern to a selected thickness;
    and the additional steps executed between the steps of removing and laminating and stripping of:
    removing part of the film of insulator material adjacent a surface thereof to form a second planar surface of insulator material coplanar with a plane defined by extremities of the interconnects; and
    forming a second conductive circuit pattern on said second planar surface in electrical communication with said interconnects.

9. The method according to claim 8 above further comprising the step of bonding a second uniformly thick preformed film of flowable insulator material to said second planar surface and the second conductive circuit pattern.

10. The method according to claim 8 above further comprising the step of bonding a substrate to said second planar surface and second conductive circuit pattern formed thereon using a second film of said flowable insulator material sandwiched therebetween.

11. The method according to claim 7 above wherein said step of removing part of the insulator material comprises the step of removing part of the insulator material adjacent a surface thereof by sanding.

12. The method according to claim 1 above, wherein the step of forming includes the step of electroplating copper to the selected thickness.

13. The method according to claim 3 above, wherein the step of applying a thin lubricating film comprises the step of applying a thin lubricating film of wax lubricant to the surface of the photosensitive material.

14. The method of forming sharp definition, high density printed circuitry for interconnection of circuit components by the process of placing photosensitive material between a smooth, polished substrate and a photo mask defining a desired circuit pattern, exposing the photosensitive material through the mask, developing the exposed photosensitive material to remove the photosensitive material from regions where circuit conductors are to be formed, forming circuit conductors of desired thickness in the regions where circuit conductors are to be formed, removing the remaining photosensitive material, laminating a preformed, dry film of flowable insulator material to the substrate and circuit conductors formed thereon and removing the insulator material and circuit conductors from the substrate, the placing step comprising the steps of: placing a selected thickness of the photosensitive material on the smooth, polished substrate, the photosensitive material having a thickness at least equal to a desired printed circuit thickness and a surface; placing the photo mask defining a desired circuit pattern adjacent the surface of the photosensitive material, and wringing the photo mask into intimate contact with the surface of the photosensitive material.

15. The method of forming sharp definition printed circuitry on a polymer film base comprising the steps of:

placing a layer of photosensitive masking material on a smooth surface having at least a relatively thin layer of conductive material thereon;

placing a photo mask defining a circuit pattern to be printed adjacent the layer of photosensitive masking material, said circuit pattern including a plurality of conductors positioned at least as densely as 0.001 inch wide conductors on 0.003 inch centers;

wringing the photo mask into high integrity intimate contact with the photosensitive material;

exposing the photosensitive material through the photo mask;

developing the photosensitive material to expose the thin layer of conductive material at locations where a conductive pattern is to be printed;

depositing conductive material on the locations exposed through the photo mask;

stripping all photosensitive material;

laminating a uniformly thick preformed sheet of flowable insulating material to said thin layer of conductive material and to the deposited conductive material;

removing the insulating material, deposited conductive material and thin layer of conductive material from the smooth surface; and etching the thin layer of conductive material.

16. The method according to claim 15 above, further comprising between the steps of developing and depositing, the step of forming on the locations exposed through the photomask a metal mask of material different from the material of the thin layer of conductive material.

* * * * *

UNITED STATES PATENT AND TRADEMARK OFFICE
CERTIFICATE OF CORRECTION

PATENT NO. : 4,159,222

DATED : June 26, 1979

INVENTOR(S) : Sanford Lebow et al

It is certified that error appears in the above—identified patent and that said Letters Patent are hereby corrected as shown below:

Column 4, line 57, after "layer" and before "pattern", insert --circuit--.

Signed and Sealed this

First Day of January 1980

[SEAL]

Attest:

SIDNEY A. DIAMOND

Attesting Officer

Commissioner of Patents and Trademarks